(12) United States Patent
Roy et al.

(10) Patent No.: US 12,018,387 B2
(45) Date of Patent: Jun. 25, 2024

(54) METHOD FOR FABRICATING A SEMICONDUCTOR DEVICE USING WET ETCHING AND DRY ETCHING AND SEMICONDUCTOR DEVICE

(71) Applicant: Infineon Technologies Austria AG, Villach (AT)

(72) Inventors: Saurabh Roy, Villach (AT); Matteo Dainese, Munich (DE); Michael Ehmann, Villach (AT); Hiroshi Narahashi, Villach (AT); Johanna Schlaminger, Villach (AT); Katharina Teichmann, Munich (DE); Sigrid Wabnig, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/582,656

(22) Filed: Jan. 24, 2022

(65) Prior Publication Data
US 2022/0235470 A1 Jul. 28, 2022

(30) Foreign Application Priority Data
Jan. 25, 2021 (EP) ..................... 21153306

(51) Int. Cl.
*C23F 1/44* (2006.01)
*H01L 21/3213* (2006.01)

(52) U.S. Cl.
CPC .......... *C23F 1/44* (2013.01); *H01L 21/32134* (2013.01)

(58) Field of Classification Search
CPC ................. C23F 1/44; H01L 21/32134; H01L 2224/05082; H01L 2224/05184; H01L 2224/05638; H01L 24/00; H01L 24/05; H01L 24/27; H01L 24/29; H01L 21/76865; H01L 23/53252; H01L 24/83; H01L 2224/04026; H01L 2224/05166; H01L 2224/05655; H01L 2224/05672; H01L 2224/2761; H01L 2224/27618; H01L 2224/27622; H01L 2224/29017; H01L 2224/29339; H01L 2224/83191;
(Continued)

(56) References Cited

U.S. PATENT DOCUMENTS

| 5,792,672 A * | 8/1998 | Chan .................. G03F 7/427 257/E21.256 |
| 6,210,846 B1 * | 4/2001 | Rangarajan ............ G03F 7/40 257/E21.255 |
| 2003/0082913 A1 | 5/2003 | Danielson et al. |

(Continued)

FOREIGN PATENT DOCUMENTS

| CN | 112259466 A | 1/2021 | |
| DE | 102015107041 A1 * | 11/2015 | ............. H01L 24/03 |

(Continued)

*Primary Examiner* — Duy Vu N Deo
(74) *Attorney, Agent, or Firm* — Murphy, Bilak & Homiller, PLLC

(57) ABSTRACT

A method for fabricating a semiconductor device comprises depositing a TiW layer on a semiconductor substrate, depositing a Ti layer on the TiW layer, depositing a Ni alloy layer on the Ti layer, depositing an Ag layer on the Ni alloy layer, at least partially covering the Ag layer with photoresist, wet etching the Ag layer and the Ni alloy layer, and dry etching the Ti layer and the TiW layer.

11 Claims, 5 Drawing Sheets

(58) Field of Classification Search
CPC ..... H01L 2224/83399; H01L 21/32136; H01L 21/32133; H01L 21/32139; H01L 29/45
USPC .......................................... 438/690–714, 754
See application file for complete search history.

(56) References Cited

U.S. PATENT DOCUMENTS

| | | |
|---|---|---|
| 2004/0113273 A1 | 6/2004 | Chen et al. |
| 2012/0074572 A1 | 3/2012 | Fischer et al. |
| 2013/0302980 A1* | 11/2013 | Chandrashekar ........................... H01L 21/76877 438/666 |
| 2014/0077377 A1 | 3/2014 | Sasaki et al. |
| 2014/0167270 A1 | 6/2014 | Ganitzer et al. |
| 2014/0357055 A1* | 12/2014 | Gissibl .............. H01L 21/76841 438/704 |
| 2015/0325535 A1* | 11/2015 | Henneck ................. H01L 24/05 257/773 |
| 2016/0218074 A1 | 7/2016 | Seddon et al. |
| 2017/0033067 A1* | 2/2017 | Kramp .............. H01L 21/76832 |
| 2018/0005951 A1 | 1/2018 | Lin et al. |
| 2020/0152445 A1 | 5/2020 | Chiu et al. |

FOREIGN PATENT DOCUMENTS

| | | | |
|---|---|---|---|
| WO | WO-0113413 A1 * | 2/2001 | ............... G03F 7/40 |
| WO | WO-2013148880 A1 * | 10/2013 | ............. C23C 16/04 |

\* cited by examiner

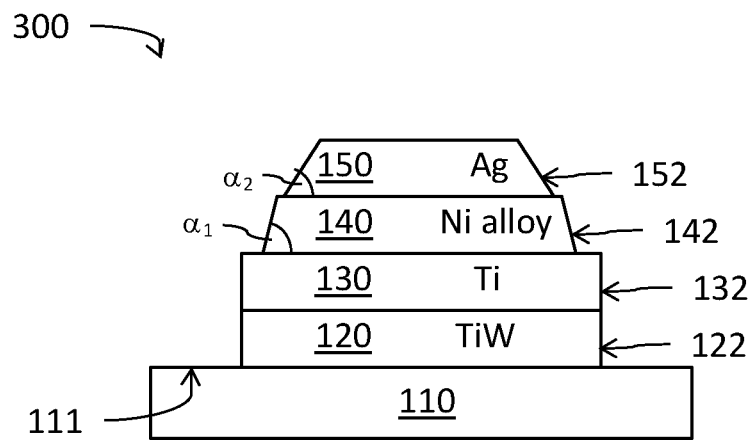
Fig. 3
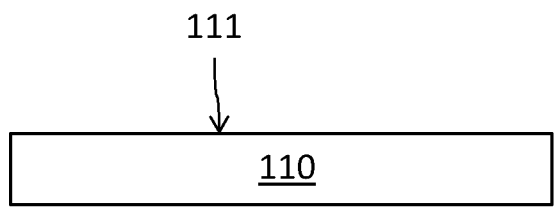
Fig. 4A
| 150 | Ag |
|---|---|
| 140 | Ni alloy |
| 130 | Ti |
| 120 | TiW |
| 110 | |
Fig. 4B

METHOD FOR FABRICATING A SEMICONDUCTOR DEVICE USING WET ETCHING AND DRY ETCHING AND SEMICONDUCTOR DEVICE

RELATED APPLICATIONS

The instant application claims priority to EPO patent application EP21153306.2 filed on Jan. 25, 2021, the content of which is incorporated by reference herein in its entirety.

TECHNICAL FIELD

This disclosure relates in general to a method for fabricating semiconductor devices, wherein wet etching and dry etching are used, as well as to a semiconductor device.

BACKGROUND

Semiconductor devices, in particular power semiconductor devices, may comprise electrical interconnections which need to be able to carry a large electrical current and/or withstand a high voltage. This requirement for example affects an interconnection between a load electrode of a power semiconductor die and a substrate like e.g., a leadframe, a direct copper bond (DCB), a direct aluminum bond (DAB), an active metal brazing (AMB), etc. One possible interconnection technique comprises sintering the semiconductor die to the substrate using a dedicated sintering metal layer. The specific material for the sintering metal layer may for example be chosen based on its high electrical and thermal conductivity, low processing temperature, high reliability, low cost, etc. Manufacturing of such an interconnection comprising a sintering metal layer may comprise depositing a stack of different metals on the semiconductor substrate beneath the sintering metal layer. The metal layers of this stack may for example be configured as diffusion barrier layer, inter-adhesion layer, etc. Furthermore, the metal stack may need to be patterned in order to define metallization areas on the chip. This patterning process should not be too time consuming in order to save costs, but it should also produce clean sidewall profiles and avoid undercuts in the patterned metal stack which otherwise could pose reliability risks due to their potential for trapping humidity. Improved methods for fabricating semiconductor devices as well as improved semiconductor devices may help with solving these and other problems.

The problem on which the invention is based is solved by the features of the independent claims. Further advantageous examples are described in the dependent claims.

SUMMARY

Various aspects pertain to a method for fabricating a semiconductor device, the method comprising: depositing a TiW layer on a semiconductor substrate, depositing a Ti layer on the TiW layer, depositing a Ni alloy layer on the Ti layer, depositing an Ag layer on the Ni alloy layer, at least partially covering the Ag layer with photoresist, wet etching the Ag layer and the Ni alloy layer, and dry etching the Ti layer and the TiW layer.

Various aspects pertain to a semiconductor device, comprising: a semiconductor substrate, a TiW layer arranged on the semiconductor substrate, a Ti layer arranged on the TiW layer, a Ni alloy layer arranged on the Ti layer, and an Ag layer arranged on the Ni alloy layer, wherein the Ag layer and the Ni alloy layer comprise side faces fabricated by at least one wet etching process, and wherein the Ti layer and the TiW layer comprise side faces fabricated by a dry etching process.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

FIG. 3 shows a sectional view of a further semiconductor device, wherein side walls of first metal layers of a metal layer stack are arranged at an angle of less than 90° with respect to a first main side of a semiconductor substrate, and wherein side walls of second metal layers of a metal layer stack are perpendicular to the first main side.

FIGS. 4A to 4F show a semiconductor device in various stages of fabrication, according to an exemplary method for fabricating semiconductor devices.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Also, the term "exemplary" is merely meant as an example, rather than the best or optimal.

The examples of a semiconductor device may comprise various types of semiconductor chips or circuits incorporated in the semiconductor chips, among them AC/DC or DC/DC converter circuits, power MOS transistors, power Schottky diodes, JFETs (Junction Gate Field Effect Transistors), power bipolar transistors, logic integrated circuits, analogue integrated circuits, power integrated circuits, chips with integrated passives, etc.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor chips may have contact pads (or electrodes) which allow electrical contact to be made with the integrated circuits included in the semiconductor chips. The electrodes may be arranged all at only one main face of the semiconductor chips or at both main faces of the semiconductor chips. They may include one or more electrode metal layers which are applied to the semiconductor material of the semiconductor chips. The electrode metal layers may be manufactured with any desired geometric shape and any desired material composition.

The notation XY refers to an alloy of X including at least Y as a further component. In particular, it may refer to an alloy of X including Y as a sole residual component (i.e. a closed composition). That is, in the second case, the notation XY means that the alloy XY has a composition consisting of X (of the percentage in weight of X) and Y (of the percentage in weight of Y), the balance being only inevitable elements. The notation XYZ . . . has an analogous meaning, i.e. an "open composition" or a "closed composition" with X, Y, Z . . . forming the sole constituents of the alloy (except inevitable elements).

Figure 1:
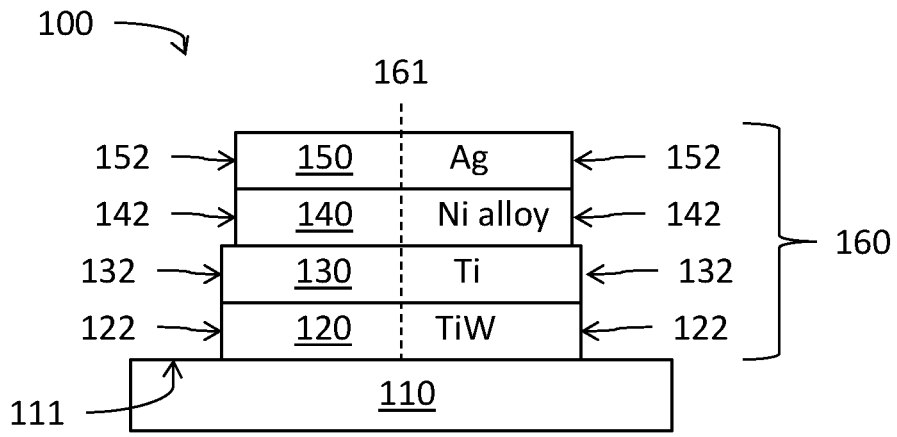
FIG. 1 shows a sectional view of a semiconductor device comprising a metal layer stack, wherein first ones of the metal layers are patterned by wet etching and second ones of the metal layers are patterned by dry etching.

FIG. 1 shows an exemplary semiconductor device 100 comprising a semiconductor substrate 110, a TiW layer 120, a Ti layer 130, a Ni alloy layer 140, and an Ag layer 150.

The Ni alloy layer 140 may comprise an alloy of nickel and another suitable element. NiV, NiSi and NiN are examples of suitable alloys, though it is contemplated that other nickel alloys might also be suitable. For simplicity, an embodiment utilizing a NiV layer will be described from this point forward.

The TiW layer 120 is arranged on the semiconductor substrate 110, e.g. on a first main side 111. The Ti layer 130 is arranged on the TiW layer 120, in particular directly on the TiW layer 120. The NiV layer 140 is arranged on the Ti layer 130, in particular directly on the Ti layer 130. The Ag layer 150 is arranged on the NiV layer 140, in particular directly on the NiV layer 140.

The TiW layer 120, the Ti layer 130, the NiV layer 140, and the Ag layer 150 comprise respective side faces 122, 132, 142, 152 which may be arranged at an angle with respect to the first main side 111 of the semiconductor substrate. For example, one or more of the side faces 122, 132, 142, 152 may be arranged essentially perpendicular with respect to the first main side 111.

The side faces 152 of the Ag layer 150 and the side faces 142 of the NiV layer 140 are fabricated by a wet etching process. In other words, the side faces 152, 142 comprise a surface structure and/or a microstructure that is fabricated by a wet etching process. The side faces 132 of the Ti layer 130 and the side faces 122 of the TiW layer 120 are fabricated by a dry etching process. In other words, the side faces 132, 122 comprise a surface structure and/or a microstructure that is fabricated by a dry etching process.

The semiconductor substrate 110 may for example comprise a semiconductor wafer, a semiconductor panel, or a singulated semiconductor die. The semiconductor substrate 110 may have any suitable thickness measured perpendicular to the first main side 111.

According to an example, the semiconductor device 100 comprises a dielectric layer arranged between the semiconductor substrate 110 and the TiW layer 120. The dielectric layer may for example comprise or consist of a polymer, e.g. an imide. The TiW layer 120 may be arranged at least partially directly on the dielectric layer.

The TiW layer 120 may comprise Ti and W or it may completely consist of Ti and W, except for unavoidable contaminants. The TiW layer 120 may comprise any suitable ratio of Ti to W. Likewise, the Ti layer 130 may comprise or consist of Ti, except for unavoidable contaminants. The NiV layer 140 may comprise or consist of Ni and V in any suitable ratio and it may comprise unavoidable contaminants. The Ag layer 150 may comprise or consist of Ag and it may also comprise unavoidable contaminants.

The layers 120, 130, 140, and 150 may have any suitable thickness measured perpendicular to the first main side 111. According to an example, the TiW layer 120 has a thickness in the range of 100 nm to 300 nm, e.g. about 150 nm. The Ti layer 130 may for example have a thickness in the range of 5 nm to 150 nm, e.g. about 100 nm. The NiV layer 140 may for example have a thickness in the range of 100 nm to 500 nm, e.g. about 300 nm. The Ag layer 150 may for example have a thickness in the range of 200 nm to 800 nm, e.g. about 450 nm.

The Ag layer 150 may be configured as a sinter layer, meaning that the semiconductor device 100 may be electrically and mechanically coupled to a substrate by sintering the Ag layer 150 to the substrate. The Ag layer 150 may essentially be comprised of an Ag film deposited on the NiV layer 140. The Ag layer 150 may comprise voids between individual Ag particles, wherein during sintering the semiconductor device 100 to a substrate, these voids shrink.

According to an example, all respective side faces 122, 132, 142, 152 are essentially coplanar (i.e. all side faces 122, 132, 142, 152 on the left side in FIG. 1 are essentially coplanar and all side faces 122, 132, 142, 152 on the right side in FIG. 1 are essentially coplanar). According to another example, one or more of the side faces 122, 132, 142, 152 are not coplanar with the others. For example, the side faces 122, 132 of the TiW layer 120 and the Ti layer 130 may be coplanar or almost coplanar with each other but not coplanar with the side faces 142, 152 of the NiV layer 140 and the Ag layer 150.

The metal layers 120, 130, 140, and 150 may be part of a layer stack 160. The layer stack 160 may have a center line 161 which is arranged perpendicular to the first main side 111 and which is also arranged essentially at the middle of each of the layers 120, 130, 140, 150 or at least at the middle of the majority of the layers 120, 130, 140, 150.

According to an example, one or more of the side faces 122, 132, 142, 152 are recessed towards the center line 161 with respect to the other side faces. In particular, an upper one of the side faces 122, 132, 142, 152 (as seen from above the Ag layer 150) may be recessed with respect to a lower one of the side faces 122, 132, 142, 152. For example, the side faces 142 of the NiV layer 140 may be recessed towards the center line 161 with respect to the side faces 132 of the Ti layer 130.

According to an example, the layer stack 160 is free of any undercut between the layers 120, 130, 140, and 150. In other words, no side face of a lower one of the layers 120, 130, 140, 150 is recessed towards the center line 161 with respect to a respective side face of an upper one of the layers 120, 130, 140, 150. This means that the TiW layer 120 has at least the same lateral extension (measured perpendicular to the center line 161) from the center line 161 as the Ti layer 130; the Ti layer 130 has at least the same lateral extension from the center line 161 as the NiV layer 140; the NiV layer 140 has at least the same lateral extension from the center line 161 as the Ag layer 150.

As mentioned above, the TiW layer 120 and Ti layer 130 are patterned by dry etching, whereas the NiV layer 140 and the Ag layer 150 are patterned by wet etching. One advantage of this two-step etching scheme may be that different metal materials may exhibit different etching rates which may make it difficult or impossible to obtain a smooth side face profile (in particular a side face profile free of any undercuts) in only one single etching process. By using a wet etching process for patterning the upper layers (NiV layer 140 and Ag layer 150) and using a subsequent dry etching process for patterning the lower layers (TiW layer 120 and Ti layer 130) however an optimal side face profile free of any undercuts can be obtained.

Figure 2:
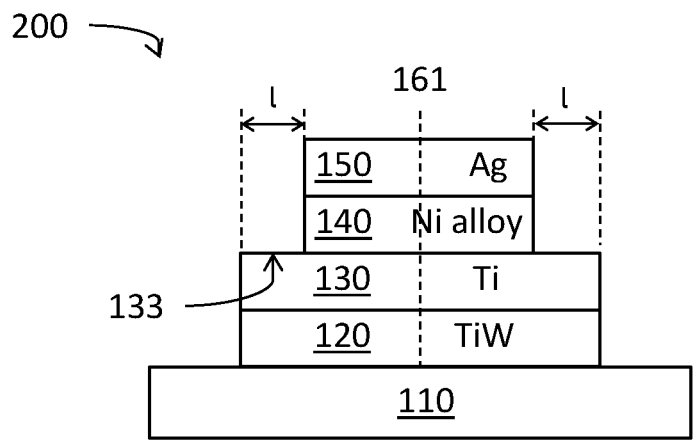
FIG. 2 shows a sectional view of a further semiconductor device, wherein upper metal layers of a metal layer stack are recessed with respect to lower metal layers of the metal layer stack.

FIG. 2 shows a semiconductor device 200 which may be similar to or identical with the semiconductor device 100. In the semiconductor device 200, the NiV layer 140 and the Ag layer 150 are recessed towards the center line 161 with respect to the TiW layer 120 and the Ti layer 130. This offset between the NiV layer 140 and Ag layer 150 on the one hand and the TiW layer 120 and Ti layer 130 on the other hand may for example be due to the fact that two different etching processes were used to pattern the layers 140, 150 and 120, 130. As mentioned further above, the NiV layer 140 and Ag layer 150 may e.g. be patterned with a wet etching process and the TiW layer 120 and Ti layer 130 may be patterned with a dry etching process.

According to an example, the offset between the NiV layer 140 and Ag layer 150 on the one hand and the TiW layer 120 and Ti layer 130 on the other hand has a length 1 of 1 μm or more, or 2 μm or more, or 3 μm or more, or 4 μm or more, or 5 μm or more.

According to an example, the semiconductor device 200 comprises a further offset between the TiW layer 120 and the Ti layer and/or a further offset between the NiV layer 140 and the Ag layer 150. The further offsets may have a shorter length than the length 1 of the offset between the Ti layer 130 and the NiV layer 140 shown in FIG. 2. For example, the further offsets may have a length of 1 μm or less, or 500 nm or less, or 100 nm or less.

According to an example, an exposed part of an upper side 133 of the Ti layer 130 may have a microstructure essentially fabricated by a wet etching process. The exposed part of the upper side 133 is that part of the upper side 133 that is not covered by the NiV layer 140. The microstructure of the exposed part of the upper side 133 may be formed while wet etching the NiV layer 140 and Ag layer 150.

FIG. 3 shows a semiconductor device 300 which may be similar to or identical with the semiconductor devices 100 and 200. In the semiconductor device 300, the side faces 142 of the NiV layer 140 are arranged at an angle $\alpha_1$ with respect to the first main side 111, wherein the angle $\alpha_1$ is smaller than 90°. Furthermore, the side faces 152 of the Ag layer 150 are arranged at an angle $\alpha_2$ with respect to the first main side 111, wherein the angle $\alpha_2$ is also smaller than 90°. The side faces 122, 132 of the TiW layer 120 and Ti layer 130 on the other hand may be arranged perpendicular or essentially perpendicular with respect to the first main side 111.

The side faces 142, 152 of the NiV layer 140 and Ag layer 150 being sloped and the side faces 122, 132 of the TiW layer 120 and Ti layer 120 being vertical may be due to the different etching techniques used to pattern the layers 140, 150 and 120, 130. A wet etching process is an isotropic patterning process which may produce sloped side faces, whereas dry etching is an anisotropic patterning process which may produce vertical or almost vertical side faces.

The angles $\alpha_1$ and $\alpha_2$ need not necessarily be identical. However, it is also possible that they are identical or almost identical. The angles $\alpha_1$ and $\alpha_2$ may have any value, dependent on the specific etching parameters used, e.g. 80° or less, or 70° or less, or 60° or less, or 50° or less.

According to an example, there is an offset between the side faces 142 and 152, e.g. a small offset of no more than 5 μm or no more than 1 μm, or no more than 500 nm. However, it is also possible that the side faces 142 and 152 are essentially coplanar. Furthermore, the side faces 142, 152 need not necessarily be planar and may e.g. have a bent shape.

FIGS. 4A to 4F show the semiconductor device 300 in various stages of fabrication, according to an exemplary method for fabricating semiconductor devices. A similar method may be used to fabricate the semiconductor devices 100 and 200.

As shown in FIG. 4A, the semiconductor substrate 110 is provided. This may comprise arranging the semiconductor substrate 110 on a temporary carrier, e.g. a tape. According to an example, a dielectric layer like an imide layer (not shown in FIG. 4A) may be deposited on the first main side 111. The dielectric layer may be patterned in order to provide an electrical contact to e.g. transistor structures of the semiconductor substrate 110. According to an example, the first main side 111 is a backside of the semiconductor substrate 110 and according to another example, it is a front side of the semiconductor substrate 110.

As shown in FIG. 4B, the layer stack 160 is deposited on the first main side 111 of the semiconductor substrate 110. The individual layers 120, 130, 140, and 150 of the layer stack 160 may e.g. be deposited in individual, subsequent processes.

One or more of the layers 120, 130, and 140 may e.g. be deposited using a sputtering process, an electroplating process, a vapor deposition process, or any other suitable deposition technique. The Ag layer 150 may e.g. be deposited using a spraying process, a cold plasma assisted deposition process, or any other suitable deposition technique.

The layer stack 160 may be deposited such that it completely covers the first main side 111 of the semiconductor substrate 110 or it may be deposited such that it covers the first main side 111 only partially (e.g. by using an appropriate mask).

Figure 4C:
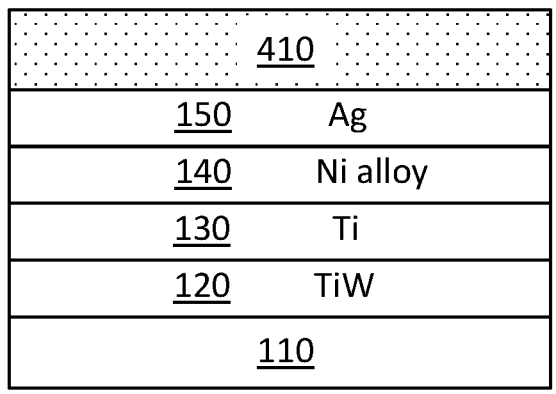

As shown in FIG. 4C, a photoresist layer 410 is deposited on the Ag layer 150. The photoresist layer 410 may be applied such that it completely covers the Ag layer 150. Any suitable type of photoresist may be used, e.g. IX335.

Figure 4D:
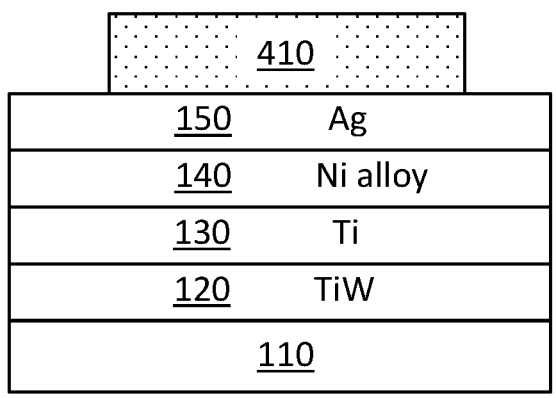

As shown in FIG. 4D, the photoresist layer 410 may be patterned using any suitable photolithography technique.

Figure 4E:
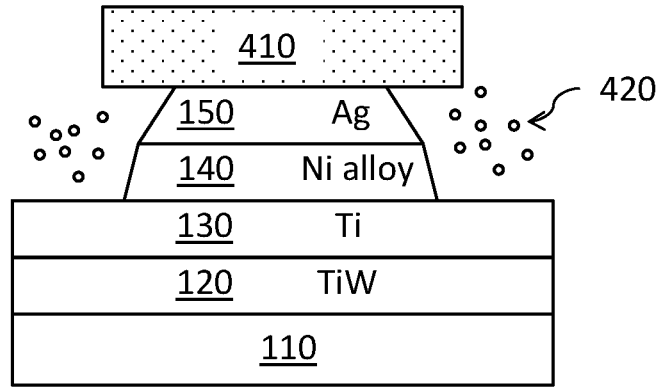

As shown in FIG. 4E, a wet etching process is used to etch the Ag layer 150 and the NiV layer 140. The wet etching chemistry 420 may be chosen such that the Ag layer 150 and NiV layer 140 are readily etched, whereas the Ti layer 130 and TiW layer 120 are not readily etched. According to an example, the wet etching chemistry 420 comprises a solution comprising phosphoric acid, acetic acid and nitric acid. One exemplary wet etching solution comprises 47.5% phosphoric acid, 1.5% nitric acid, 35% acetic acid and 16% water.

The wet etching process may essentially be an isotropic patterning process. Therefore, the Ag layer 150 and/or NiV layer 140 may form an undercut under the photoresist layer 410.

Figure 4F:
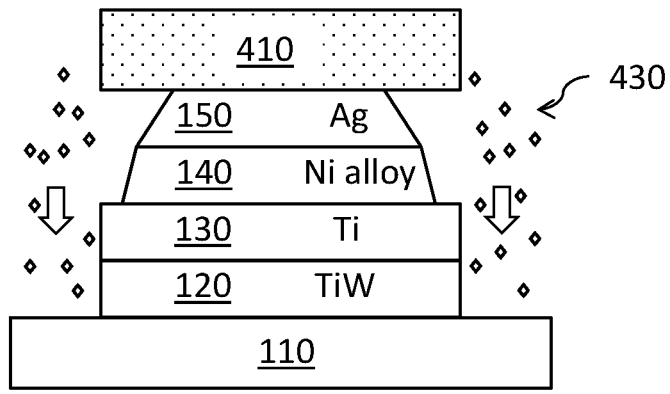

As shown in FIG. 4F, a dry etching process is used to etch the Ti layer 130 and TiW layer 120. Dry etching may e.g. be done with an etching gas 430 comprising chlorine and fluorine (e.g. $Cl_2$ and $SF_6$). The dry etching process may e.g. comprise reactive ion etching or any other suitable technique. In particular, particles of the etching gas 430 may be accelerated towards the first main side 111, thereby anisotropically etching the Ti layer 130 and TiW layer 120. Since the Ag layer 150 and NiV layer 140 are covered by the photoresist layer 410, no dry etching is performed on these layers, according to an example.

The same photoresist layer 410 may be used for both the wet etching process shown in FIG. 4E and the dry etching process shown in FIG. 4F. However, it is also possible that the photoresist 410 is removed after the wet etching process and new photoresist 410 is applied in a further photolithography process, prior to the dry etching process.

According to an example, the dry etching process is performed within 12 hours or less of the wet etching process, or within 6 hours or less, or within 1 hour or less.

According to an example, the dry etching process is stopped once the dielectric layer beneath the TiW layer 120 is reached. This may e.g. be determined by spectrographically checking for particles of the dielectric layer (e.g. imides in the case that the dielectric layer is an imide layer) are alternatively for particles of the semiconductor substrate 110 in the exhaust gas of the etching chamber. The etching apparatus may be equipped with a spectrometer for this purpose. The etching process may be stopped automatically once the particles of the dielectric layer or the semiconductor substrate 110 are detected by the spectrometer.

According to a further method for fabricating a semiconductor device, the wet etching process as described with respect to FIG. 4E is used for etching the Ag layer 150, the NiV layer 140, and also the Ti layer 130. The dry etching process as described with respect to FIG. 4F is only used for etching the TiW layer 120. In this case, tight control of the etching times may be necessary in order to obtain satisfying etching results.

According to yet another method for fabricating a semiconductor device, the TiW layer 120 and Ti layer 130 are deposited on the semiconductor substrate 110 as described with respect to FIG. 4B. Consequently, photoresist 410 is deposited on the Ti layer 130, a lithography process is performed and the TiW layer 120 and Ti layer 130 are dry etched. The Ti layer 130 may be striped, e.g. by using hydrofluoric acid, in order to preserve a clean TiW surface (avoid contact of TiW with photoresist). Afterwards, a new Ti layer 130, the NiV layer 140 and the Ag layer 150 may be deposited and patterned by wet etching.

Figure 5:
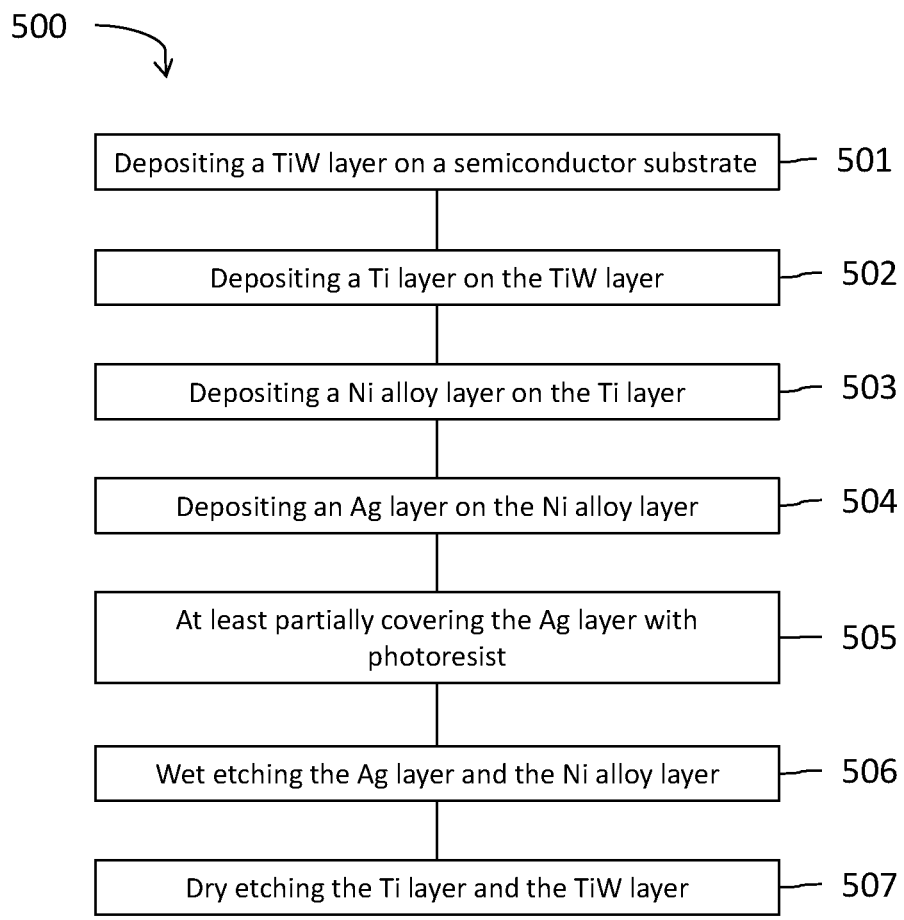
FIG. 5 is a flow chart of an exemplary method for fabricating semiconductor devices.

FIG. 5 is a flow chart of an exemplary method 500 for fabricating a semiconductor device. The method 500 may for example be used for fabricating the semiconductor devices 100, 200 and 300.

The method 500 comprises at 501 an act of depositing a TiW layer on a semiconductor substrate, at 502 an act of depositing a Ti layer on the TiW layer, at 503 an act of depositing a Ni alloy layer on the Ti layer, at 504 an act of depositing an Ag layer on the Ni alloy layer, at 505 an act of at least partially covering the Ag layer with photoresist, at 506 an act of wet etching the Ag layer and the Ni alloy layer, and at 507 an act of dry etching the Ti layer and the TiW layer.

The wet etching at 506 may for example be done using a solution comprising phosphoric acid, acetic acid and nitric acid. The dry etching at 507 may for example be done using an etching gas comprising chlorine and fluorine.

In the following, the semiconductor device and the method for fabricating a semiconductor device are further described using specific examples.

Example 1 is a method for fabricating a semiconductor device, the method comprising: depositing a TiW layer on a semiconductor substrate, depositing a Ti layer on the TiW layer, depositing a Ni alloy layer on the Ti layer, depositing an Ag layer on the Ni alloy layer, at least partially covering the Ag layer with photoresist, wet etching the Ag layer and the Ni alloy layer, and dry etching the Ti layer and the TiW layer.

Example 2 is the method of example 1, wherein the wet etching is done using a solution comprising phosphoric, acetic and nitric acid.

Example 3 is the method of example 1 or 2, wherein the dry etching is done using a gas comprising chlorine and fluorine.

Example 4 is the method of one of the preceding examples, wherein the Ag layer, the Ni alloy layer, the Ti layer and the TiW layer form a layer stack, and wherein as viewed from above the Ag layer, after the dry etching each respective lower layer of the layer stack has a greater lateral extension than a respective upper layer of the layer stack, such that the layer stack is free of any undercuts between different layers of the layer stack.

Example 5 is the method of one of the preceding examples, further comprising: during the dry etching, spectroscopically analyzing an exhaust gas for residues removed by the dry etching, and stopping the dry etching once residues of the semiconductor substrate or of a further layer arranged between the semiconductor substrate and the TiW layer are detected in the exhaust gas.

Example 6 is the method of one of the preceding examples, wherein the dry etching is performed within no more than 12 hours of the wet etching, in particular within no more than 6 hours, further in particular within no more than 1 hour.

Example 7 is the method of one of the preceding examples, wherein the photoresist is applied only once and is used for both the wet etching and the dry etching.

Example 8 is the method of one of examples 1 to 6, wherein between the wet etching and the dry etching the photoresist is removed and then re-applied.

Example 9 is the method of one of the preceding examples, further comprising: arranging an imide layer between the semiconductor substrate and the TiW layer.

Example 10 is the method of one of the preceding examples, wherein the Ni alloy is selected from the group comprising NiV, NiSi and NiN.

Example 11 is a semiconductor device, comprising: a semiconductor substrate, a TiW layer arranged on the semiconductor substrate, a Ti layer arranged on the TiW layer, a Ni alloy layer arranged on the Ti layer, and an Ag layer arranged on the Ni alloy layer, wherein the Ag layer and the Ni alloy layer comprise side faces fabricated by at least one wet etching process, and wherein the Ti layer and the TiW layer comprise side faces fabricated by a dry etching process.

Example 12 is the semiconductor device of example 11, further comprising: an imide layer arranged between the semiconductor substrate and the TiW layer.

Example 13 is the semiconductor device of example 11 or 12, wherein the TiW layer has a thickness in the range of 100 nm to 300 nm, measured perpendicular to a first main face of the semiconductor substrate, wherein the TiW layer is arranged on the first main face.

Example 14 is the semiconductor device of one of examples 11 to 13, wherein the Ti layer has a thickness in the range of 5 nm to 150 nm, measured perpendicular to a first main face of the semiconductor substrate, wherein the TiW layer is arranged on the first main face.

Example 15 is the semiconductor device of one of examples 11 to 14, wherein the Ni alloy layer has a thickness in the range of 100 nm to 500 nm, measured perpendicular to a first main face of the semiconductor substrate, wherein the TiW layer is arranged on the first main face.

Example 16 is the semiconductor device of one of examples 11 to 15, wherein the Ag layer has a thickness in the range of 200 nm to 800 nm, measured perpendicular to a first main face of the semiconductor substrate, wherein the TiW layer is arranged on the first main face.

Example 17 is an apparatus comprising means for performing the method of one of examples 1 to 10.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A method for fabricating a semiconductor device, the method comprising:
   depositing a TiW layer on a semiconductor substrate,
   depositing a Ti layer on the TiW layer,
   depositing a Ni alloy layer on the Ti layer,
   depositing an Ag layer on the Ni alloy layer,
   at least partially covering the Ag layer with photoresist,
   wet etching the Ag layer and the Ni alloy layer, and
   dry etching the Ti layer and the TiW layer,
   wherein the Ag layer, the Ni alloy layer, the Ti layer and the TiW layer form a layer stack, and
   wherein as viewed from above the Ag layer, after the dry etching, the Ti layer and the TiW layer of the layer stack have a greater lateral extension than the Ag layer and the Ni alloy layer of the layer stack, such that the layer stack is free of any undercuts between different layers of the layer stack.

2. The method of claim 1, wherein the wet etching is done using a solution comprising phosphoric acid, acetic acid and nitric acid.

3. The method of claim 1, wherein the dry etching is done using a gas comprising chlorine and fluorine.

4. The method of claim 1, further comprising:
   during the dry etching, spectroscopically analyzing an exhaust gas for residues removed by the dry etching, and
   stopping the dry etching once residues of the semiconductor substrate or of a further layer arranged between the semiconductor substrate and the TiW layer are detected in the exhaust gas.

5. The method of claim 1, wherein the dry etching is performed within no more than 12 hours of the wet etching.

6. The method of claim 1, wherein the photoresist is applied only once and is used for both the wet etching and the dry etching.

7. The method of claim 1, wherein between the wet etching and the dry etching, the photoresist is removed and then re-applied.

8. The method of claim 1, further comprising:
   arranging an imide layer between the semiconductor substrate and the TiW layer.

9. The method of claim 1, wherein the Ni alloy is selected from the group comprising NiV, NiSi and NiN.

10. The method of claim 1, wherein at least one of the TiW layer, the Ti layer, the Ni alloy layer, and the Ag layer comprise respective side faces arranged at an angle with respect to a first main side of the semiconductor substrate.

11. The method of claim 10, wherein the angle of the respective side faces of the Ni alloy layer is a first angle, the angle of the respective side faces of the Ag layer is a second angle, the angle of the respective side faces of the Ti layer is a third angle, and the angle of the respective side faces of the TiW layer is a fourth angle.

* * * * *